United States Patent
Marconi et al.

(10) Patent No.: US 9,647,313 B2
(45) Date of Patent: May 9, 2017

(54) SURFACE MOUNT MICROWAVE SYSTEM INCLUDING A TRANSITION BETWEEN A MULTILAYER ARRANGEMENT AND A HOLLOW WAVEGUIDE

(71) Applicant: Huawei Technologies Co., Ltd., Shenzhen, Guangdong (CN)

(72) Inventors: Franco Marconi, Milan (IT); Fabio Morgia, Milan (IT); Haiou Gou, Chengdu (CN); Stefano Verzura, Milan (IT); Guoyu Su, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/335,602

(22) Filed: Jul. 18, 2014

(65) Prior Publication Data

US 2014/0327490 A1    Nov. 6, 2014

Related U.S. Application Data

(63) Continuation of application No. PCT/CN2013/071257, filed on Feb. 1, 2013.

(30) Foreign Application Priority Data

Jan. 19, 2012    (EP) .................................... 12151801

(51) Int. Cl.
*H01P 5/107* (2006.01)
*H01Q 9/04* (2006.01)
(Continued)

(52) U.S. Cl.
CPC .............. *H01P 5/107* (2013.01); *H01P 3/081* (2013.01); *H01P 3/121* (2013.01); *H01Q 9/0407* (2013.01);
(Continued)

(58) Field of Classification Search
CPC ....................................................... H01P 5/107
(Continued)

(56) References Cited

U.S. PATENT DOCUMENTS

| 4,074,270 A | 2/1978 | Kaloi |
| 5,867,073 A * | 2/1999 | Weinreb .................. H01P 5/107 333/26 |

(Continued)

FOREIGN PATENT DOCUMENTS

| CN | 1890785 A | 1/2007 |
| CN | 102084538 A | 6/2011 |

(Continued)

OTHER PUBLICATIONS

"Taclamplus—Laser-ablatable Sequential Multilayer Very Low Loss Low Moisture Absorption High Peel Strength Uniform & Consistent DK," Taconic, Publication Jun. 2007:100-22, Petersburgh, New York (Jun. 2007).

(Continued)

*Primary Examiner* — Benny Lee
(74) *Attorney, Agent, or Firm* — Leydig, Voit & Mayer, Ltd.

(57) ABSTRACT

The invention relates to a surface mount microwave system, comprising a multilayer arrangement comprising a first conductive layer, a second conductive layer and a dielectric layer, wherein the first conductive layer is arranged on the dielectric layer, and wherein the dielectric layer is arranged on the second conductive layer, wherein the first conductive layer comprises a microwave circuit and wherein the second conductive layer forms a reference potential layer, a hollow microwave waveguide being at least partly formed in the second conductive layer, and a microwave transition structure for electromagnetically coupling the first conductive layer with the hollow microwave waveguide. According to (Continued)

some implementation forms, a reflector on a cover covering the multilayer arrangement may be avoided.

17 Claims, 8 Drawing Sheets

(51) Int. Cl.
*H01P 3/08* (2006.01)
*H01P 3/12* (2006.01)
(52) U.S. Cl.
CPC ............ *H01L 2224/48091* (2013.01); *H01L 2224/48227* (2013.01)
(58) Field of Classification Search
USPC ........................................................ 333/26
See application file for complete search history.

(56) References Cited

U.S. PATENT DOCUMENTS

| | | | | |
|---|---|---|---|---|
| 5,982,250 | A * | 11/1999 | Hung et al. ................ | 333/26 |
| 6,958,662 | B1 * | 10/2005 | Salmela et al. ............ | 333/26 |
| 2002/0097108 | A1 * | 7/2002 | Jain ........................ | H01P 3/121 |
| | | | | 333/26 |
| 2003/0231078 | A1 * | 12/2003 | Koriyama et al. ......... | 333/26 |
| 2004/0119554 | A1 * | 6/2004 | Tahara ..................... | H01P 5/107 |
| | | | | 333/26 |
| 2006/0091971 | A1 | 5/2006 | Tahara et al. | |
| 2007/0111528 | A1 | 5/2007 | Sasaki et al. | |
| 2007/0120618 | A1 * | 5/2007 | Peulevey et al. .......... | 333/26 |
| 2010/0297557 | A1 | 11/2010 | Cameron et al. | |
| 2011/0057741 | A1 * | 3/2011 | Dayan et al. .............. | 333/26 |
| 2011/0140979 | A1 * | 6/2011 | Dayan et al. .............. | 343/772 |
| 2011/0181373 | A1 | 7/2011 | Kildal | |
| 2011/0267153 | A1 | 11/2011 | Hirota et al. | |
| 2014/0022742 | A1 * | 1/2014 | Shen et al. ............... | H05K 1/18 |
| | | | | 361/748 |

FOREIGN PATENT DOCUMENTS

| | | |
|---|---|---|
| EP | 1274149 A2 | 1/2003 |
| EP | 1304762 A2 | 4/2003 |
| EP | 1923950 A1 | 5/2008 |
| FR | 2462787 A1 | 2/1981 |
| JP | 2010256859 A | 11/2010 |
| WO | WO 2011109939 A1 | 9/2011 |

OTHER PUBLICATIONS

Office Action in corresponding European Patent Application No. 12151801.3 (Dec. 5, 2016).

* cited by examiner

SURFACE MOUNT MICROWAVE SYSTEM INCLUDING A TRANSITION BETWEEN A MULTILAYER ARRANGEMENT AND A HOLLOW WAVEGUIDE

CROSS-REFERENCE TO RELATED APPLICATIONS

This application is a continuation of International Patent Application No. PCT/CN2013/071257, filed on Feb. 1, 2013, which claims priority to European Patent Publication No. EP12151801.3, filed on Jan. 19, 2012, both of which are hereby incorporated by reference in their entireties.

BACKGROUND OF THE INVENTION

The present invention relates to surface mount microwave systems.

Surface mount microwave systems (SMMS) are widely used for communication purposes, in particular in the frequency range from 42 GHz to 60 GHz. Usually, surface mount microwave systems comprise one or more bare dies which constitute a multifunction system on package (SoP). In particular in the above-mentioned frequency range, microstrip lines or guiding electromagnetic waves are deployed.

In order to electromagnetically couple such microstrip lines to a hollow waveguide, the SoPs may be provided with covers having embedded waveguide reflectors, as is described in European Application EP 1 923 950 A1. Therefore, such covers form a part of an electrical design which is associated with further electrical constraints which may be taken into account when designing the electrical characteristics of a SoP.

European Application EP 1 274 149 A2 discloses a radio frequency circuit manufactured by using a metal-core substrate having an insulating material laminated on a metal substrate such as of copper or aluminum or the like and, more particularly, a manufacturing method for a radio frequency circuit on a high frequency range of a microwave or millimeter-wave band and to such a radio frequency circuit.

U.S. Pat. No. 4,074,270 A discloses a low physical profile antennas and particularly an assembly of electric microstrip antennas and antenna systems that can be arrayed on a single substrate and tuned to several different frequency bands. European Application EP1 304 762 A2 discloses coupling structures which convert electrical signals from one transmission medium to another, and more particularly coupling structures which convert electrical signals from planar transmission lines to waveguides.

French Application FR 2 462 787 A1 discloses a transition device for coupling a waveguide with a microwave line and also a microwave source comprising such transition device.

SUMMARY OF THE INVENTION

Embodiments of the invention are based on the finding that an efficient surface mount microwave system may be provided if a number of electrical constraints limiting the electrical design is reduced. Such reduction may be achieved by a dedicated microwave transition structure for electromagnetically coupling e.g. a microstrip line of the surface mount microwave system with a hollow microwave waveguide. Such microwave transition structure may be arranged on the die of the surface mount microwave system. Therefore, a cover with a waveguide reflector is not necessary.

According to an aspect, a surface mount microwave system comprises a multilayer arrangement comprising a first conductive layer, a second conductive layer and a dielectric layer, wherein the first conductive layer is arranged on the dielectric layer, and wherein the dielectric layer is arranged on the second conductive layer, wherein the first conductive layer comprises a microwave circuit and wherein the second conductive layer forms a reference potential layer. A hollow microwave waveguide is at least partly formed in the second conductive layer, and a microwave transition structure for electromagnetically coupling the first conductive layer with the hollow microwave waveguide is provided.

The microwave transition structure can for example be a part of the multilayer arrangement and provide a dedicated electromagnetic coupling between the first conductive layer and the hollow microwave waveguide.

According to a first implementation form, in the surface mount microwave system at least a part of the first conductive layer forms or connects to the microwave circuit. The microwave circuit can for example be formed by conductive portions being shaped to have certain microwave characteristics. However, the microwave circuit can also be any electronic circuit, e.g. a MMIC.

According to a second implementation form, the microwave transition structure comprises a conductive microstrip radiating pattern being formed on the dielectric layer for irradiating an electromagnetic wave towards the hollow microwave waveguide. The microwave transition structure can for example be formed as a conductive structure by at least a part of the first conductive layer.

According to a third implementation form, the microstrip radiating pattern comprises a microstrip line being formed by the first conductive layer, and another microstrip line, the other microstrip line being wider than the microstrip line, the other microstrip line being attached to the broadened portion, the broadened portion being formed for irradiating an electromagnetic wave towards the hollow microwave waveguide. The broadened portion can for example form a radiating structure of pattern which enables an electromagnetical coupling towards the hollow microwave waveguide.

According to a fourth implementation form, the surface mount microwave system comprises a dielectric waveguide, which can for example be formed by a part of the dielectric layer.

According to a fifth implementation form, the dielectric waveguide is formed by a portion of the dielectric layer arranged between the first and second conductive layer. The portion of the dielectric layer can for example be arranged beneath the aforementioned broadened portion for a direct electromagnetical coupling. Furthermore, the portion of the dielectric layer can for example be surrounded or delimited by a plurality of grounded holes.

According to a sixth implementation form, the dielectric waveguide is formed by a portion of the dielectric layer arranged between the first and second conductive layer. The portion of the dielectric layer can for example be delimited by a grounded metalized slot surrounding the aforementioned broadened portion.

According to a seventh implementation form, the second conductive layer comprises a hollow portion, in particular a slot, forming at least a part of the hollow microwave waveguide. Thus, the second conductive layer can for example form walls of the hollow microwave waveguide.

According to an eighth implementation form, the second conductive layer comprises a hollow portion, in particular a slot, forming at least a part of the hollow microwave waveguide. The waveguide adaptor can for example form a radiating interface for interfacing towards the hollow microwave waveguide which can for example be formed by a slot in the second conductive layer.

According to a ninth implementation form, the second conductive layer has a thickness which is equal to or greater than 50% or 60% or 70% or 80% or 90% of a total thickness of the base stack.

According to a tenth implementation form, the first conductive layer, the dielectric layer and the second conductive layer form a dual layer laminate structure.

According to an eleventh implementation form, the surface mount microwave system further comprises a third conductive layer forming a connecting layer which can for example be attached to the second layer by a FR4 prepreg.

According to a twelfth implementation form, the surface mount microwave system further comprises a coaxial transmission line coupled or embedded on the second conductive layer e.g. for electrically connecting one or a plurality of pads on the third conductive layer to the first conductive layer.

According to a thirteenth implementation form, the surface mount microwave system further comprises one or a plurality of holes for connecting the ground portion of third layer to the reference potential layer.

According to a fourteenth implementation form, the second conductive layer forms a ground layer.

According to a fifteenth implementation form, the surface mount microwave system further comprises a further hollow waveguide having metallic walls formed by angular portions behind the second conductive layer forming a waveguide interface towards the hollow waveguide.

According to a sixteenth implementation form, the first conductive layer is hollowed down to the second conductive layer to obtain at least one pocket for accommodating one or more microwave devices.

According to a seventeenth implementation form, the surface mount microwave system further comprises an attachable cover, e.g. a FR4 cover, with an outside metal plating, in particular an attachable cover for covering the first conductive layer and the attached microwave components.

According to an eighteenth implementation form, the attachable cover is be free of any electrical constraint and does not form any part of the microwave transition structure.

According to some aspects or implementation forms, the invention provides a package structure suitable up to 90 GHz with the surface mount microwave system.

According to some aspects or implementation forms, the package structure comprises a microstrip to dielectric waveguide transition on the first conductive layer.

According to some aspects or implementation forms, a dielectric to air waveguide transition on the back side of the package is provided.

According to some aspects or implementation forms, a reflector is omitted on the attachable cover.

According to some aspects or implementation forms, the attachable cover is externally metalized for shielding action only.

According to some aspects or implementation forms, the attachable cover exhibits, internally, high loss cavity preventing on air signal propagation.

According to some aspects or implementation forms, a three layer compact PCB forms the multilayer arrangement.

According to some aspects or implementation forms, a thick inner copper plate is an integral part of the microwave laminate forming the multilayer arrangement.

According to some aspects or implementation forms, a thick inner copper plate is an integral part of the waveguide transition design.

According to some aspects or implementation forms, the inner thick copper plate is an integral part of the high performance top-to-back coaxial connections.

BRIEF DESCRIPTION OF THE FIGURES

Further embodiments will be described with respect to the following figures, in which.

DETAILED DESCRIPTION OF EMBODIMENTS OF THE INVENTION

Figure 1:
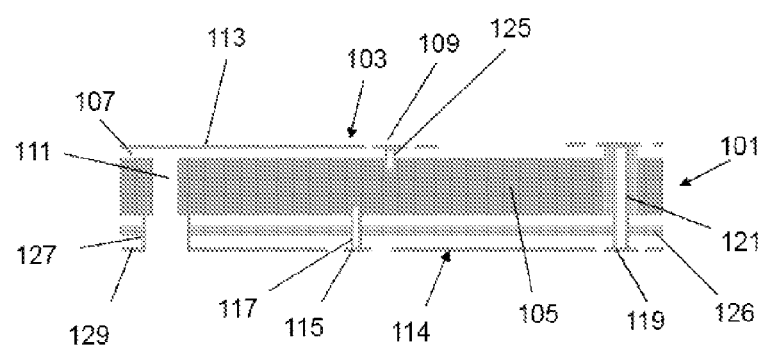
FIG. 1 shows a surface mount microwave system according to an implementation form.

FIG. 1 shows a surface mount microwave system according to an implementation form. The surface mount microwave system comprises a multilayer arrangement 101 having a first conductive layer 103, a second conductive layer 105 and a dielectric layer 107. The first conductive layer 103 is at least partly arranged on the dielectric layer 107, wherein the dielectric layer 107 is arranged on the second conductive layer 105. The first conductive layer 103 comprises a microwave circuit 109, which is formed by a conductive pattern of the first conductive layer 103. The multilayer arrangement 101 can for example form a laminate structure with laminated layers according to an implementation form.

The surface mount microwave system further comprises a hollow microwave waveguide 111 which is formed at least partly in the second conductive layer 105. Furthermore, a microwave transition structure 113 is provided for electromagnetically coupling the first conductive layer 103 and the hollow microwave waveguide 111.

According to some implementation forms, the surface mount microwave system further comprises a third conductive layer 114 for connecting to the first layer 103. The first conductive layer can for example comprise pads for connecting to any of the layers of the surface mount microwave system. The third conductive layer 114 can for example comprise a pad 115 connected through a via 117 to the second conductive layer 105. The third conductive layer 114 can for example further comprise a further pad 119 connected through another via 121 to the first conductive layer 103. The first conductive layer 103 can for example have a layer portion 109 connected through a via 125 to the second conductive layer 105.

According to some implementation forms, the surface mount microwave system further comprises an FR4 prepreg 126 arranged between the second conductive layer 105 and the third conductive layer 114.

According to some implementation forms, the surface mount microwave system comprises a further waveguide 127 having angular portions 129 and forming a waveguide interface towards the hollow microwave waveguide 111.

The first connecting layer 103 can for example comprise copper (Cu) and may have a thickness of 0.017 mm. The dielectric layer 107 may have a thickness of 0.1 mm. The second conductive layer 105 may have a thickness of 0.7 mm and may comprise or consist of copper (Cu). The FR4 prepreg 126 can for example have a thickness of 0.1 mm, and the third conductive layer 114 may have a thickness of 0.017 mm.

With reference to FIG. 1, the FR4 prepreg 126 allows adding the third conductive layer 114 to obtain three conductive layers microwave printed circuit board.

According to some implementation forms, the first conductive layer 103 is used for microwave design, the second conductive layer 105 is used for ground and power dissipation, and the first conductive layer 114 is used for connecting parts.

According to some implementation forms, the second conductive layer 105 has a thickness which may be 80% of the total height of a resulting printed circuit board which allows designing high performance top-to-back microwave coaxial connections.

According to some implementation forms, the third conductive layer 114 provides for proper SMT pads to interface the system with e.g. an external board for DC and RF connections and for signaling e.g. up to 29 GHZ.

In order to manufacture the surface mount microwave system shown in FIG. 1, holes may be drilled through the multilayer arrangement comprising e.g. a copper foil forming the first conductive layer 103, a dielectric substrate forming the dielectric layer 107 and the copper baking forming the second conductive layer 107.

According to some implementation forms, the holes are filled with ceramic hole filler. Thereafter, over-plate vias and surface vias are provided. Thereafter, a tracking pattern on both sides is printed and etched. Thereafter, milling the slot S is performed.

The above-mentioned manufacturing steps may be different according to the PCB shop manufacturing process.

Furthermore, a clean room surface mounted microwave system assembling process can for example be performed. The process comprises an epoxy dispensing, MMICs picking and placing, manual and/or visual inspection, curing (polymerization), plasma-cleaning, wire or ribbon bondings, DC test and cover attached by using e.g. a conductive glue.

Figure 2:
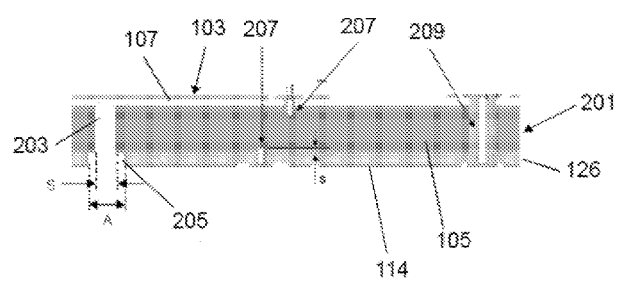
FIG. 2 shows a multilayer arrangement according to an implementation form.

FIG. 2 shows a multilayer arrangement 201 according to an implementation form. The multilayer arrangement 201 differs from the multilayer arrangement 101 shown in FIG. 1 in that a hollow waveguide 203 with diameter or aperture S which is formed in the second conductive layer 105 has a broadened portion 205 with diameter or aperture A for interfacing purposes. Furthermore, blind ground holes 207 and a through isolated hole 209 are provided (103, 105, 107, 114, 126 in FIG. 2 are the same as in FIG. 1).

Figure 3:
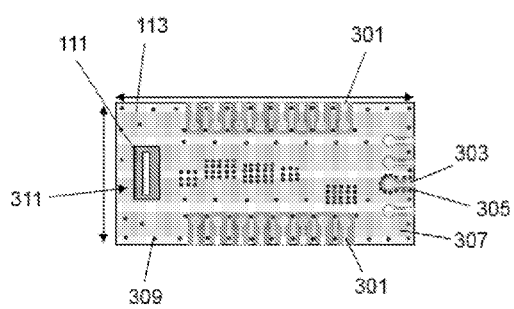
FIG. 3 shows a back view on a surface mount microwave system according to an implementation form.

FIG. 3 shows a back view on the surface mount microwave system as depicted in FIG. 1 according to an implementation form. As shown in FIG. 3, the third conductive layer 114, (114 not depicted in FIG. 3), i.e. the connecting layer, can for example comprise a plurality of signaling pads 301, e.g. DC (direct current) signaling parts. Furthermore, radio frequency (RF) microwave pads 303 may be provided. The microwave pads 303 may be surrounded by grounding holes 305 connecting to the second conductive layer 105 which is not depicted in FIG. 3. Furthermore, a ground plane 307 is provided. The ground plane 307 is connected to the second conductive layer 105 via grounding holes 309. As shown in FIG. 3, the ground plane 307 has a waveguide transition recess 311 (111, 113 in FIG. 3 are the same as in FIG. 1).

Figure 4:
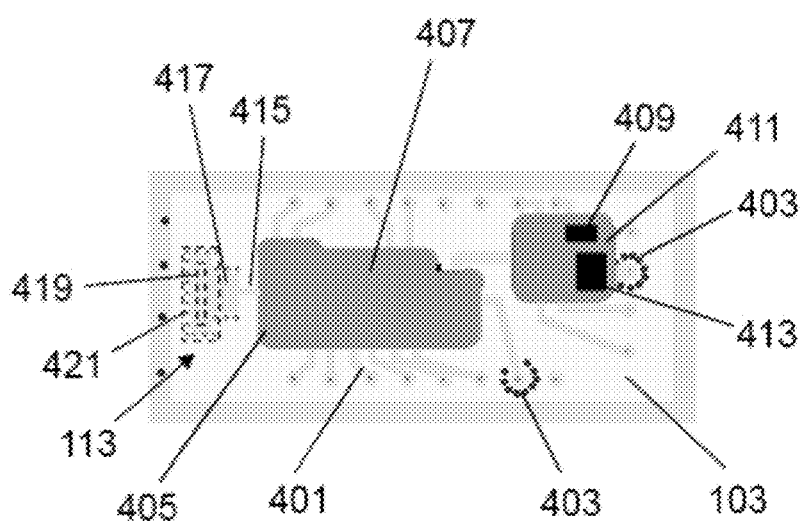
FIG. 4 shows a top view of a surface mount microwave system according to an implementation form.

FIG. 4 shows a top view of the surface mount microwave system as depicted in FIG. 1 according to an implementation form. The first conductive layer 103 may comprise a plurality of microwave circuits, e.g. microstrip lines 401 which for example are be surrounded by grounding holes 403. In addition, further microwave circuits 405 and 407 or other arrangements may be provided. The further microwave circuits 405, 407 or arrangements may respectively comprise a capacitor 409, a pocket 411, an MMIC 413 and further circuits (113 in FIG. 4 is the same as in FIG. 1).

The microwave transition structure 101 comprises for example a microstrip line 415 and another microstrip line 417 forming a microstrip adapter.

The packages shown in FIGS. 3 and 4 can for example be 20 to 25 mm long and 10 to 15 mm wide.

The dielectric waveguide 419 can for example be surrounded by ground holes 421.

Figure 5A:
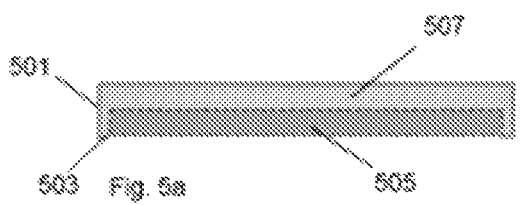
FIGS. 5a, 5b and 5c show an attachable cover according to an implementation form.
Figure 5B:
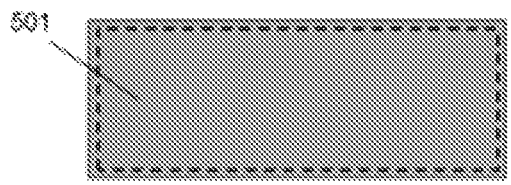
Figure 5C:
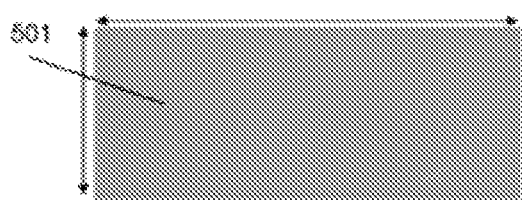

According to some implementation forms, the surface mount microwave system can for example be provided with an attachable cover as e.g. shown in FIGS. 5a, 5b and 5c. The attachable cover 501 as shown in FIG. 5a consist of copper and comprises angular portions 503. The attachable cover 501 defines a first space 505 accommodating at least a part of the surface mount microwave system. The attachable cover 501 may further define a proper thickness 507 providing mechanical robustness.

FIGS. 5a, 5b and 5c show different views of an attachable cover 501. As shown in FIGS. 5b and 5c, the attachable cover 501 can for example have a plain structure.

The cover 501 comprises or consists for example of 1.6 mm FR4 which is copper-plated outside and hollowed out internally for e.g. one half of its height as depicted in FIG. 5a. The use of FR4 allows for preventing oscillations forming the dissipation factor which may attenuate an on-air signal propagation inside the package. In particular, the cover 501 is free of any electrical constraints.

Figure 6:
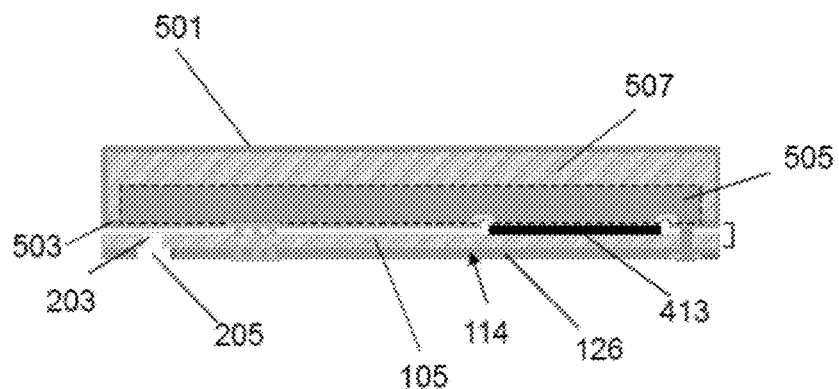
FIG. 6 shows an assembled package according to an implementation form.

FIG. 6 shows an assembled package comprising the surface mount microwave system as depicted in FIG. 1 and the attachable cover 501 as depicted in FIG. 5.a-5c. Furthermore, a MMIC 413 can for example be provided (203, 205 in FIG. 6 are the same as in FIG. 2, 503, 505, 507 in FIG. 6 are the same as in FIG. 5a-5c.

Figure 7:
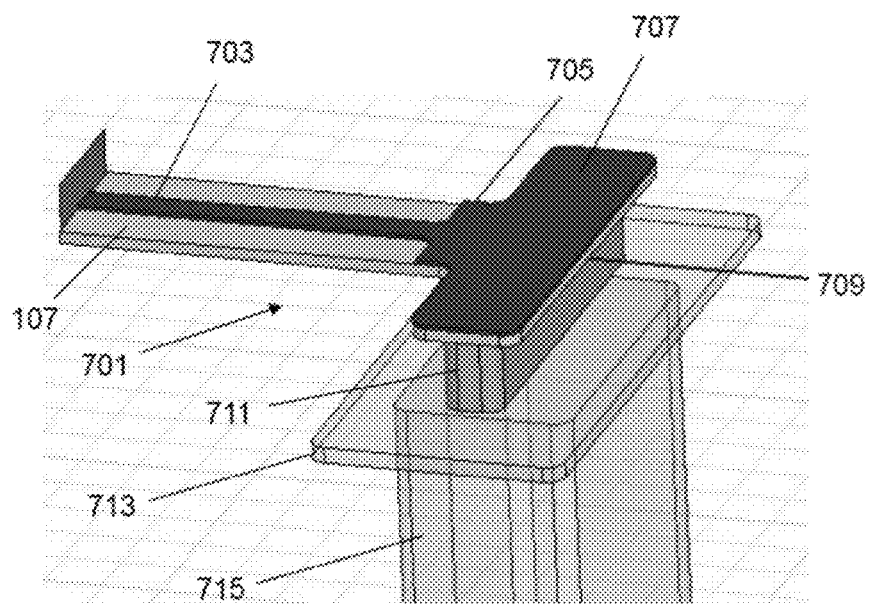
FIG. 7 shows a microwave transition structure according to an implementation form.

FIG. 7 shows a physical structure of a microwave transition structure 701 according to an implementation form. The microwave transition structure 701 can for example comprise a conductive microstrip radiating pattern which is formed on the dielectric layer 107. The microwave transition structure 701 comprises a microstrip line 703 and another microstrip line 705 which is wider than the microstrip line 703. The broadened portion 707 is arranged on a dielectric waveguide 709 which is formed by a part of the dielectric layer 107. The dielectric waveguide 709 connects to a slot 711 in the second conductive layer 105 which is not depicted in FIG. 7 for the sake of descriptional simplicity. According to an implementation, the slot 711, i.e. the hollow microwave waveguide, is connected to a waveguide adaptor 713 which forms a radiating interface towards another waveguide 715 which is depicted in FIG. 7. The other waveguide 715 can for example be a hollow microwave waveguide.

According to some implementation forms, the microwave transition structure, e.g. the microwave transition structure 701, forms a dielectric air waveguide transition which provides an input/output radiating interface backside the surface mount microwave system.

Figure 8A:
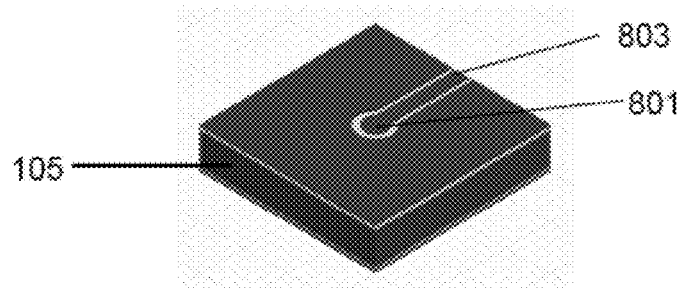
FIGS. 8a and 8b show a top-to-back coaxial connection according to an implementation form.
Figure 8B:
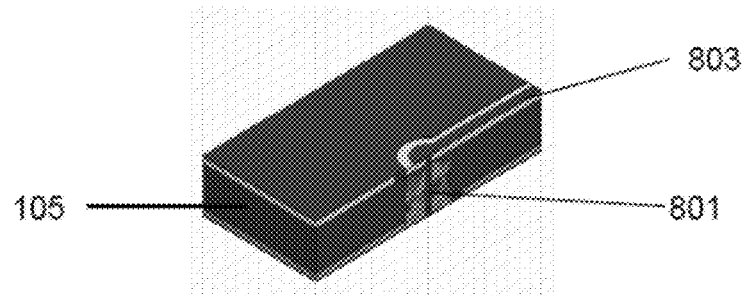

According to some implementation forms, a coaxial transmission line for connection is provided on the second conductive layer 105 for electrical connection. FIGS. 8*a* and 8*b* respectively show a physical structure of a top-to-back coaxial connection 801 being formed on the second conductive layer 105 for operating in the frequency range between e.g. 20 to 35 GHz. Further, a microstrip line 803 can for example be provided.

According to some implementation forms, the surface mount microwave system is deployed to provide MMICs which can for example be embodied into a SMT package, wherein more than one chip can for example be assembled into one package to obtain a multifunction system on package comprising e.g. a transmitter, a receiver or parts of them. Furthermore, according to some implementation forms, only a chip and via assembling line are used. Furthermore, according to some implementation forms, high-frequency bare dies are mounted inside the package so that a standard SMT automatic process is possible. According to some implementation forms, a low thermal resistance, e.g. smaller than 1°/W, may be achieved which allows a dissipation up to few watt inside the package. Furthermore, a milling the PCB backside to obtain a waveguide radiating interface can for example be performed, so that a reflector on the cover is avoided. Therefore, the cover does not need to be electrically designed in a special way. Furthermore, the manufacturing process is PCB-based and does not need to be based on a metal insert structure. In addition, an open module operating capability can for example be provided.

What is claimed is:

1. A Surface Mount Microwave System, comprising:
   a multilayer arrangement comprising a first conductive layer, a second conductive layer and a dielectric layer, wherein the first conductive layer is arranged on the dielectric layer, wherein the dielectric layer is arranged on the second conductive layer, wherein the first conductive layer comprises a microwave circuit and wherein the second conductive layer forms a reference potential layer, wherein the first conductive layer, the dielectric layer and the second conductive layer form a laminate structure;
   a hollow microwave waveguide being at least partly formed in the second conductive layer; and
   a microwave transition structure for electromagnetically coupling the first conductive layer with the hollow microwave waveguide;
   wherein the microwave transition structure comprises a conductive microstrip radiating pattern formed on the dielectric layer for irradiating an electromagnetic wave towards the hollow microwave waveguide, wherein
   the conductive microstrip radiating pattern comprises a first microstrip line that is formed by or on the first conductive layer, and a second microstrip line, the second microstrip line being wider than the first microstrip line, the second microstrip line being attached to a broadened portion, the broadened portion being formed for irradiating an electromagnetic wave towards the hollow microwave waveguide.

2. A Surface Mount Microwave System of claim 1, wherein at least a part of the first conductive layer at least partially forms the microwave circuit or connects to the microwave circuit.

3. A Surface Mount Microwave System of claim 1, wherein a portion of the dielectric layer is delimited by a grounded metalized slot surrounding the broadened portion.

4. A Surface Mount Microwave System of claim 1, comprising a dielectric waveguide, the dielectric waveguide being formed by a part of the dielectric layer.

5. A Surface Mount Microwave System of claim 4, wherein the dielectric waveguide is formed by a portion of the dielectric layer arranged between the first conductive layer and second conductive layer.

6. A Surface Mount Microwave System of claim 5, wherein the second conductive layer comprises a hollow portion, or a slot, forming at least a part of the hollow microwave waveguide.

7. A Surface Mount Microwave System of claim 6, wherein the hollow microwave waveguide is provided with a waveguide adapter for connecting the hollow microwave waveguide to a further waveguide.

8. A Surface Mount Microwave System of claim 7, wherein the second conductive layer has a thickness which is equal to or greater than 50% of a total thickness of the multilayer arrangement.

9. A Surface Mount Microwave System of claim 8, wherein the first conductive layer, the dielectric layer and the second conductive layer form a dual layer laminate structure.

10. A Surface Mount Microwave System of claim 8, further comprising a third conductive layer forming a connecting layer.

11. A Surface Mount Microwave System of claim 10, further comprising a coaxial transmission line coupled or embedded on the second conductive layer.

12. A Surface Mount Microwave System of claim 11, further comprising one or a plurality of holes for connecting the ground portion of the third conductive layer to the reference potential layer.

13. A Surface Mount Microwave System of claim 12, wherein the second conductive layer forms a ground layer.

14. A Surface Mount Microwave System of claim 13, further comprising a further hollow waveguide having metallic walls formed by angular portions behind the second conductive layer and forming a waveguide interface towards the hollow waveguide.

15. A Surface Mount Microwave System of claim 14, wherein the first conductive layer is hollowed down to the second conductive layer to obtain at least one pocket for accommodating one or more microwave devices.

16. A Surface Mount Microwave System of claim 15, further comprises an attachable cover with an outside metal plating for covering the first conductive layer and the microwave circuit.

17. A Surface Mount Microwave System of claim 1, wherein a portion of the dielectric layer is delimited by a plurality of grounded holes surrounding the broadened portion.

* * * * *